(12) United States Patent
Wötzel et al.

(10) Patent No.: US 12,482,730 B2
(45) Date of Patent: Nov. 25, 2025

(54) PACKAGE FOR A LATERAL POWER TRANSISTOR

(71) Applicant: Infineon Technologies Austria AG, Villach (AT)

(72) Inventors: Stefan Wötzel, Erfurt (DE); Marcus Böhm, Mintraching (DE)

(73) Assignee: Infineon Technologies Austria AG, Villach (AT)

( * ) Notice: Subject to any disclaimer, the term of this patent is extended or adjusted under 35 U.S.C. 154(b) by 452 days.

(21) Appl. No.: 17/992,098

(22) Filed: Nov. 22, 2022

(65) Prior Publication Data

US 2023/0178462 A1 Jun. 8, 2023

(30) Foreign Application Priority Data

Dec. 3, 2021 (EP) .................................... 21212169

(51) Int. Cl.
*H01L 23/495* (2006.01)
*H01L 23/31* (2006.01)
*H01L 23/528* (2006.01)
*H02M 3/158* (2006.01)

(52) U.S. Cl.
CPC .... *H01L 23/49562* (2013.01); *H01L 23/3107* (2013.01); *H01L 23/528* (2013.01); *H02M 3/158* (2013.01)

(58) Field of Classification Search
CPC ........... H01L 23/49562; H01L 23/3107; H01L 23/528; H01L 23/49524; H01L 23/49575; H01L 23/49541; H03K 17/687
See application file for complete search history.

(56) References Cited

U.S. PATENT DOCUMENTS

| | | | |
|---|---|---|---|
| 2009/0057855 A1* | 3/2009 | Quinones | H01L 24/40 257/676 |
| 2010/0164078 A1* | 7/2010 | Madrid | H01L 24/37 438/122 |
| 2013/0075884 A1 | 3/2013 | Gong et al. | |
| 2016/0284628 A1 | 9/2016 | Rios et al. | |
| 2017/0005025 A1* | 1/2017 | Otremba | H01L 21/56 |
| 2018/0102306 A1* | 4/2018 | Cho | H01L 21/4825 |
| 2020/0350406 A1* | 11/2020 | Ko | H01L 23/49562 |
| 2022/0084978 A1* | 3/2022 | Kinzer | H01L 25/18 |

FOREIGN PATENT DOCUMENTS

EP 3474320 A2 4/2019

* cited by examiner

*Primary Examiner* — Wasiul Haider
(74) *Attorney, Agent, or Firm* — Murphy, Bilak & Homiller, PLLC

(57) ABSTRACT

A transistor package includes a semiconductor transistor chip having opposite first and second surfaces, one or a plurality of first load electrodes, one or a plurality of second load electrodes, and a control electrode on the first surface. A leadframe faces the first surface of the semiconductor transistor chip and includes a first terminal, a second terminal, and a control terminal of the package which are exposed at a bottom of the package. The first terminal is electrically coupled to the first load electrode(s). The second terminal is electrically coupled to the second load electrode(s). The control terminal is electrically coupled to the control electrode. The first terminal is aligned with a first side of the package. The second terminal is aligned with a second side opposite the first side. The control terminal is aligned with a third side of the package which connects between the first and second sides.

13 Claims, 6 Drawing Sheets

PACKAGE FOR A LATERAL POWER TRANSISTOR

TECHNICAL FIELD

This disclosure relates generally to the technique of semiconductor packaging, and in particular to a transistor package for a lateral transistor device.

BACKGROUND

Transistor packages are widely used as electronic switches in a variety of electronic circuits. Higher efficiency, increased power density, lower switching losses, faster switching times, lower device parasitics and lower cost are among the key goals for next generation transistor package design.

Conventional approaches to reduce device parasitics (in particular drain/source inductance) for fast switching and to improve thermal behavior are to use leadless packages and/or to use clips for connecting the load electrodes of a semiconductor transistor chip to the respective terminals of the transistor package.

SUMMARY

According to an aspect of the disclosure, a transistor package comprises a semiconductor transistor chip having a first surface and a second surface opposite the first surface. The semiconductor transistor chip comprises one or a plurality of first load electrodes, one or a plurality of second load electrodes and a control electrode on the first surface. A leadframe faces the first surface of the semiconductor transistor chip. The leadframe comprises a first terminal, a second terminal and a control terminal of the transistor package. The first terminal, the second terminal and the control terminal are exposed at a bottom of the transistor package. The first terminal is electrically coupled to the one or a plurality of first load electrodes. The second terminal is electrically coupled to the one or a plurality of second load electrodes. The control terminal is electrically coupled to the control electrode. The first terminal is aligned with a first side of the transistor package. The second terminal is aligned with a second side opposite the first side of the transistor package. The control terminal is aligned with a third side of the transistor package. The third side of the transistor package connects between the first side and the second side of the transistor package.

According to another aspect of the disclosure, an electrical circuitry comprises a circuit board. A plurality of transistor packages as described above are mounted side-by-side in a lateral direction on the circuit board. The first terminals of the transistor packages are electrically connected by a first conductor provided by the circuit board. The second terminals of the transistor packages are electrically connected by a second conductor provided by the circuit board. The control terminals of the transistor packages are electrically connected by a control conductor provided by the circuit board. The first conductor and the second conductor are spaced apart from each other by a spacing region extending along the lateral direction between the first conductor and the second conductor. The control conductor extends within the spacing region.

BRIEF DESCRIPTION OF THE DRAWINGS

In the drawings, like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

It is to be understood that the features of the various exemplary embodiments and examples described herein may be combined with each other unless specifically noted otherwise.

The illustrations of FIGS. 1 to 7 are true to scale. Therefore, dimensional relationships such as "longer than", "shorter than" etc. may be directly taken from and are disclosed by the illustrations of FIGS. 1 to 7, for example.

As used in this specification, the terms "electrically connected" or "electrically coupled" or similar terms are not meant to mean that the elements are directly contacted together; intervening elements may be provided between the "electrically connected" or "electrically coupled" elements, respectively. However, in accordance with the disclosure, the above-mentioned and similar terms may, optionally, also have the specific meaning that the elements are directly contacted together, i.e. that no intervening elements are provided between the "electrically connected" or "electrically coupled" elements, respectively.

Further, the words "over" or "beneath" with regard to a part, element or material layer formed or located or arranged "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" used with regard to a part, element or material layer formed or located or arranged "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
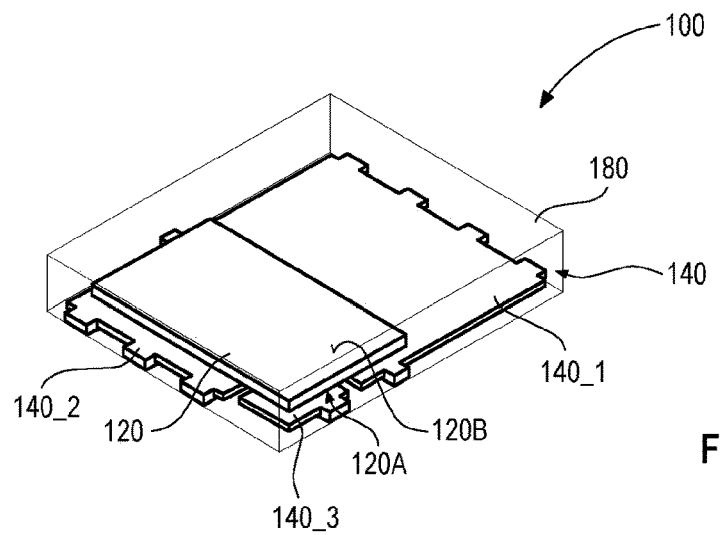
FIG. 1 is a perspective top view of a first example of a transistor package in which the encapsulant is shown semi-transparent.
Figure 2:
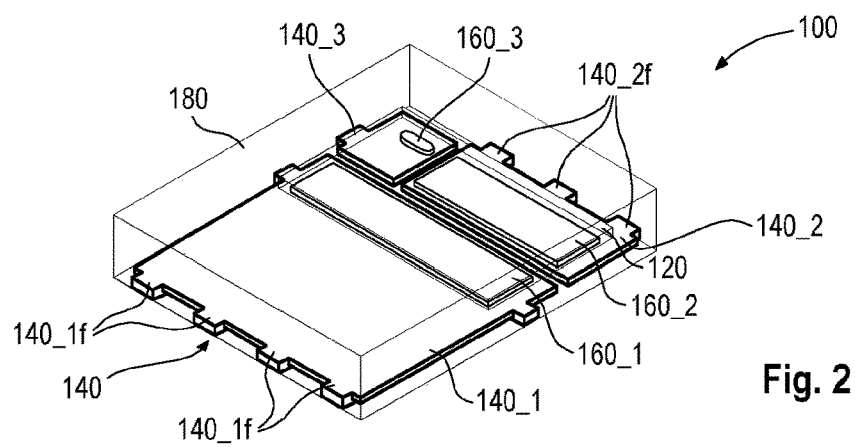
FIG. 2 is a perspective top view of the exemplary transistor package of FIG. 1 in which the encapsulant and the semiconductor transistor chip are shown semi-transparent.

Referring to FIGS. 1 and 2, a transistor package 100, according to a first example, includes a semiconductor transistor chip 120 and a leadframe 140. The semiconductor transistor chip 120 has a first surface 120A and a second surface 120B opposite the first surface 120A. The leadframe 140 is facing the first surface 120A of the semiconductor transistor chip 120. In FIG. 1 only the edge of the first surface 120A is visible since the second surface 120B is the top surface of the semiconductor transistor chip 120 when accommodated in the transistor package 100.

The leadframe 140 includes a first terminal 140_1, a second terminal 140_2 and a control terminal 140_3. The first, second and control terminals 140_1, 140_2, 140_3 are transistor package terminals, i.e. are configured to electrically connect the transistor package 100 to external circuitry such as, e.g., circuitry implemented on an application board (not shown). The first terminal 140_1, the second terminal 140_2 and the control terminal 140_3 of the leadframe 140 are separate from each other. They may be connected e.g. only to the semiconductor transistor chip 120, as will be described in more detail further below. The first terminal 140_1, the second terminal 140_2 and the control terminal 140_3 are exposed at a bottom of the transistor package 100 (see also FIG. 3).

The semiconductor transistor chip 120 comprises one or a plurality of first load electrodes, one or a plurality of second load electrodes and a control electrode on the first surface 120A of the semiconductor transistor chip 120. FIG. 2 illustrates a first contact pad 160_1, a second contact pad 160_2 and a control contact pad 160_3, which are electrically connected (e.g. directly bonded) to the first terminal 140_1, the second terminal 140_2 and the control terminal 140_3 of the leadframe 140, respectively.

The first contact pad 160_1, the second contact pad 160_2 and the control contact pad 160_3 may, e.g., be formed by the first load electrode, the second load electrode and the control electrode of the semiconductor transistor chip 120, respectively. In this case, the semiconductor transistor chip 120 is directly bonded (e.g. glued, soldered or sintered) to the leadframe 140 (i.e. to the corresponding first, second and control terminals 140_1, 140_2, 140_3 of the leadframe 140).

In other examples, the first contact pad 160_1, the second contact pad 160_2 and the control contact pad 160_3 may be provided by an electrical redistribution structure (not shown in FIGS. 1 and 2, reference is made to the examples of FIGS. 10 to 13). The electrical redistribution structure is configured to re-route one or the plurality of first load electrodes to the first contact pad 160_1, one or plurality of the second load electrodes to the second contact pad 160_2 and the control electrode of the semiconductor transistor chip 120 to the control contact pad 160_3 of the electrical redistribution structure. To that end, the first contact pad 160_1, the second contact pad 160_2 and the control contact pad 160_3 are exposed at a surface of the electrical redistribution structure facing away from the semiconductor transistor chip 120.

The semiconductor transistor chip 120 is a lateral device, i.e. the first load electrode, the second load electrode and the control electrode are all disposed on the same (first) surface 120A of the semiconductor transistor chip 120. In other words, the lateral semiconductor transistor chip 120 is implemented in the transistor package 100 in a flip-chip orientation.

The semiconductor transistor chip 120 may be configured as a power semiconductor chip. Power semiconductor chips are suitable, in particular, for switching high currents and/or medium or high voltages (e.g. more than 50 V or 100 V or 200 V or 300 V blocking voltage). In particular, exemplary transistor packages as disclosed herein may operate in the medium voltage (MV) range, in which the blocking voltage is equal to or greater than or less than 200 V or 150 V or 100 V or 50 V.

The semiconductor transistor chip 120 may be of different types. Examples described herein are, in particular, directed e.g. to HEMT (high electron mobility transistor) devices. More specifically, the semiconductor transistor chips 120 referred to herein may, e.g., be III-V compound semiconductor chips having, e.g., a high band gap. The semiconductor transistor chip 120 may, e.g., be a GaN chip. In this case, the GaN chip 120 may, e.g., be a lateral GaN-on-substrate device such as a GaN-on-Si device or a GaN-on-SiC device or a GaN-on-sapphire device, for example.

Here and in all further examples, the first terminal 140_1 may be a drain (D) package terminal and the second terminal 140_2 may be a source (S) package terminal. Likewise, the first contact pad 160_1 may be or may be connected (via the redistribution structure mentioned above) to one or a plurality of (first) drain (D) electrodes of the semiconductor transistor chip 120, and the second contact pad 160_2 may be or may be connected (via the redistribution structure) to one or a plurality of (second) source electrodes of the semiconductor transistor chip 120.

As illustrated in semi-transparent representation in FIGS. 1 and 2, the transistor package 100 may include an encapsulant 180. For instance, a molding process may be carried out to encapsulate the semiconductor transistor chip 120 mounted on the leadframe 140 with a mold material. In other words, the transistor package may include a molded encapsulant 180 forming, e.g., the package body.

Figure 3:
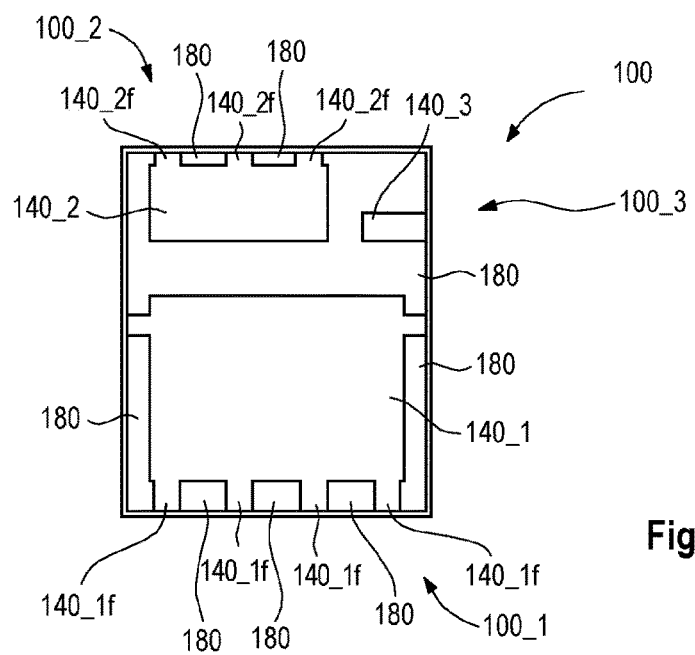
FIG. 3 is a bottom view of the exemplary transistor package of FIGS. 1 and 2.

FIG. 3 illustrates a bottom view of the transistor package 100. The bottom of the transistor package 100 may comprise or be composed of areas formed by a bottom surface of the encapsulant 180 and areas formed by a bottom surface of the first and second terminals 140_1, 140_2 and the control terminal 140_3 of the leadframe 140. In other words, the first terminal 140_1, the second terminal 140_2 and the control terminal 140_3 are exposed at the bottom of the transistor package 100.

The first terminal 140_1 is aligned with a first side 100_1 of the transistor package 100. The second terminal 140_2 is aligned with a second side 100_2 opposite the first side 100_1 of the transistor package 100. The control terminal 140_3 is aligned with a third side 100_3 of the transistor package 100. The third side 100_3 of the transistor package 100 connects between the first side 100_1 and the second side 100_2 of the transistor package 100.

The transistor package 100 may, e.g., be a leadless package. The first terminal 140_1, the second terminal 140_2 and/or the control terminal 140_3 may extend and terminate at the edge of the transistor package 100 formed, e.g., by the encapsulant 180. All terminals 140_1, 140_2, 140_3 may be flush with the bottom of the transistor package 100. More specifically, the bottom surfaces of the terminals 140_1, 140_2, 140_3 and the bottom surface of the exposed areas of the encapsulant 180 may all lie in the same (bottom) plane of the transistor package 100.

The first terminal 140_1 may have a plurality of fingers 140_1f which are exposed at the edge at the first side 100_1 of the transistor package 100. Parts of the first terminal 140_1 between these fingers 140_1f may be offset from this edge of the transistor package 100. The second terminal 140_2 may have a plurality of fingers 140_2f which are exposed at the edge at the second side 100_2 of the transistor package 100. Parts of the second terminal 140_2 between these fingers 140_2f may be offset from this edge of the transistor package 100. The control terminal 140_3 may, e.g., be exposed at the edge of the transistor package 100 at the third side 100_3 of the transistor package 100. Further, the control terminal 140_3 may be offset from the transistor package edge at the first side 100_1 and at the second side 100_2 of the transistor package 100.

A terminal 140_1, 140_2, 140_3 that is aligned with a specific side 100_1, 100_2, 100_3 of the transistor package 100 may, e.g., be exposed at the edge of the transistor package 100 at the respective transistor package side 100_1, 100_2 and 100_3.

Figure 4A:
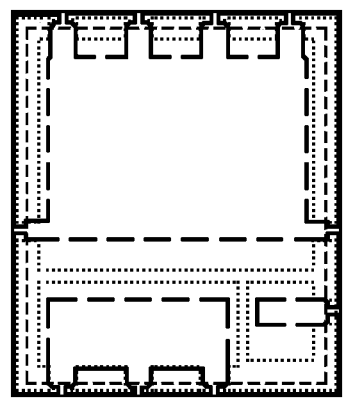
FIG. 4A is an illustration of the outlines of a bottom half etch and a top half etch of an exemplary leadframe and a transistor package body.
Figure 4B:
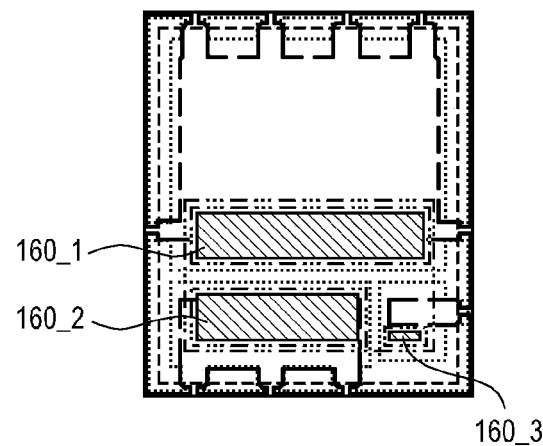
FIG. 4B is the outline representation of FIG. 4A and additionally shows first and second load electrodes and a control electrode of the semiconductor transistor chip or first and second contact pads and a control contact pad of an electrical redistribution structure.

The outlines of the terminals 140_1, 140_2, 140_3 as shown in the bottom views (e.g. FIGS. 3, 6, 7) represent the lower (i.e. footprint) surface of the respective terminal. The outlines of the terminals 140_1, 140_2, 140_3 at their upper surface may be different. In other words, the leadframe 140 may be a half etch type leadframe. FIGS. 4A and 4B illustrate outlines of a bottom half etch and a top half etch of the leadframe 140 and the outline 100_OL of the transistor package 100 formed by the encapsulant 180. As shown in FIGS. 4A and 4B, the fingers 140_1f of the first terminal 140_1 and/or the fingers 140_2f of the second terminal 140_2 and/or the control terminal 140_3 may, e.g., protrude over the outline 100_OL of the transistor package 100.

That is, the footprint of the transistor package 100 is, e.g., defined by the bottom half etch BHE_OL of the leadframe 140. The contact area between the first contact pad 160_1, the second contact pad 160_2, the control contact pad 160_3 and the leadframe 140 is defined by the top half etch THE_OL of the leadframe 140. The outline of the semiconductor transistor chip 120 is indicated by the reference sign 120_OL.

In more general terms, the leadframe 140 and hence the first, second and/or control terminals 140_1, 140_2, 140_3 thereof may be of a half etch type providing for top surface areas and bottom (footprint) surface areas which are different from each other in shape. This allows to "re-route" the layout of the contact pads 160_1, 160_2, 160_3 (which may or may not be identical with the layout of the electrodes on the first surface 120A of the semiconductor transistor chip 120—see e.g. FIGS. 10 to 13) to the footprint layout of the terminals 140_1, 140_2, 140_3 at the bottom of the transistor package 100.

Figure 5:
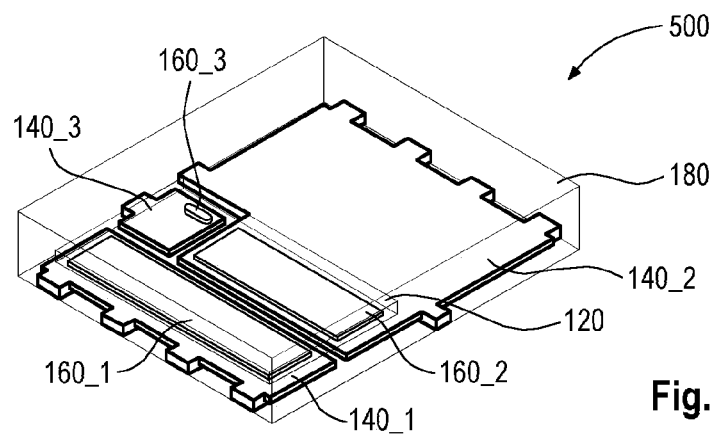
FIG. 5 is a perspective top view of a second example of a transistor package in which the encapsulant and the semiconductor transistor chip are shown semi-transparent.

FIG. 5 is a perspective top view of a second example of a transistor package 500. Similar to FIG. 2 the encapsulant 180 and the semiconductor transistor chip 120 are shown semi-transparent, while the first, second and control contact pads 160_1, 160_2, 160_3 are visible.

The transistor package 500 is designed largely in accordance with the features described for the transistor package 100. Therefore, to avoid reiteration, reference is made to the above disclosure.

Figure 6:
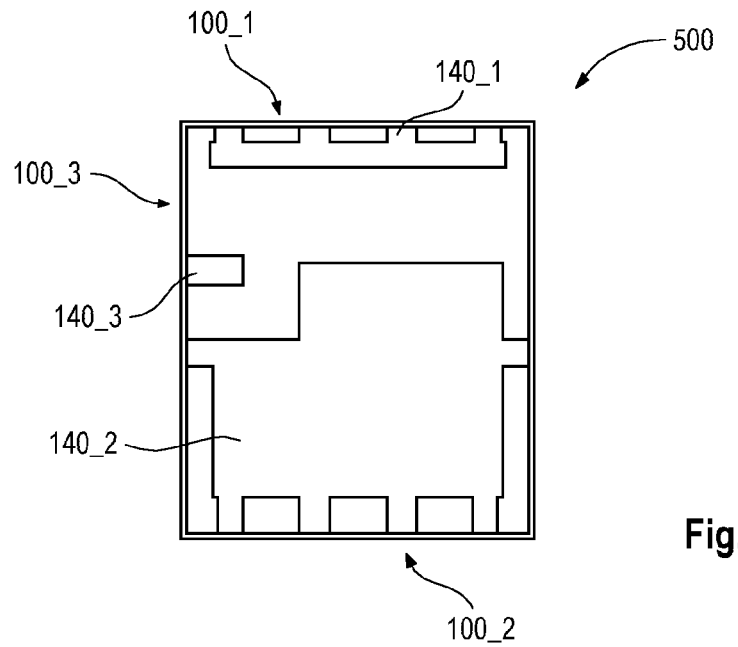
FIG. 6 is a bottom view of the exemplary transistor package of FIG. 5.

The transistor package 500 distinguishes from the transistor package 100 in that the control terminal 140_3 is arranged between the first terminal 140_1 and the second terminal 140_2. Referring to FIG. 6, the first terminal 140_1 and the second terminal 140_2 are spaced apart at the bottom of the transistor package 500 by a gap. The control terminal 140_3 is located within this gap.

More specifically, there is an imaginary straight line parallel to the transistor package edge at the third side 100_3 of the transistor package 500 which intersects with the first terminal 140_1, the second terminal 140_2 and the control terminal 140_3.

The second terminal 140_2 may have a polygonal shape with a cutout corner area, see FIG. 6. The cutout corner area faces the first terminal 140_1 and the control terminal 140_3 is located within the cutout corner area.

For example, the first terminal 140_1 may be the drain (D) terminal of the transistor package 500 and the second terminal 140_2 may be the source (S) terminal of the transistor package 500.

Figure 7:
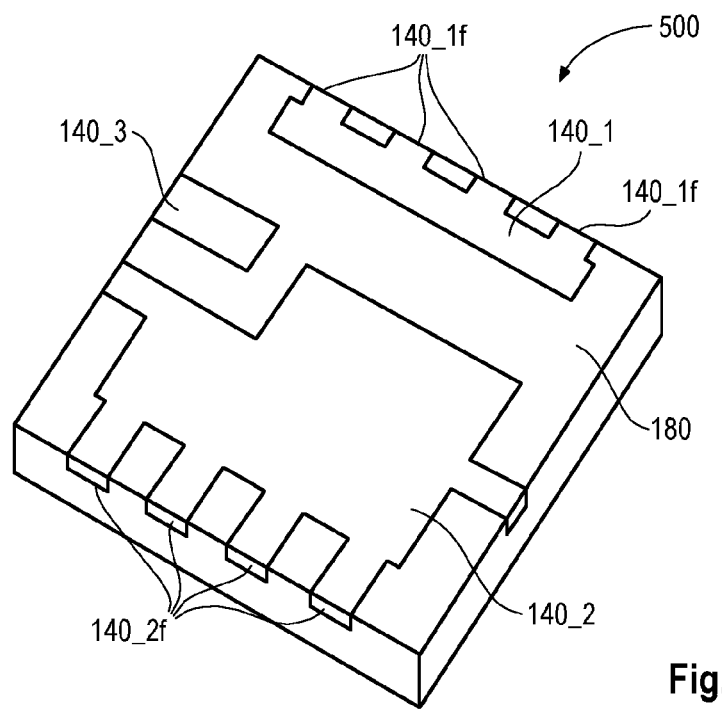
FIG. 7 is a perspective bottom view of a mirrored version of the second example transistor package of FIGS. 5 and 6.

The layout of the first, second and control terminals 140_1, 140_2, 140_3 at the bottom of the transistor package 100, 500 should be optimized in terms of prevention of creepage. Creepage occurs at the bottom of the transistor package 100, 500 and is dependent on the mold material composition of the encapsulant 180 and the spacings between the terminals 140_1, 140_2, 140_3. Typically, creepage between the source (S) and gate (G) terminal (e.g. the second terminal 140_2 and the control terminal 140_3) is not critical, since the source terminal is usually on common ground and the gate terminal is usually on a potential which is only a few volts offset from common ground. However, creepage between the drain (D) and source (S) terminals (e.g. the first and second terminals 140_1 and 140_2) and creepage between the drain (D) terminal (e.g. first terminal 140_1) and the gate (G) terminal (control terminal 140_3) is critical since the drain (D) terminal is usually on high voltage during operation. Therefore, a sufficient creepage distance at the bottom of the transistor package 100, 500 should be maintained between these terminals. Considering the package outline constraints as illustrated in FIGS. 3, 6 and 7 this condition is much easier to meet with the control terminal 140_3 aligned with the third side 100_3 of the transistor package 100, 500 than with conventional leadframe terminal layouts.

Due to the face-down orientation of the semiconductor transistor chip 120, the transistor packages 100, 500 disclosed herein allow to achieve low parasitics for fast switching and high thermal connectivity. Further, given a GaN semiconductor transistor chip 120 is used, the face-down orientation of the GaN transistor chip 120 allows to align the transistor package footprint with the footprints of common MOSFET (Metal Oxide Semiconductor Field Effect Transistor) packages which, however, cannot fulfill the fast switching requirements of the transistor package 100, 500 described herein.

Figure 8:
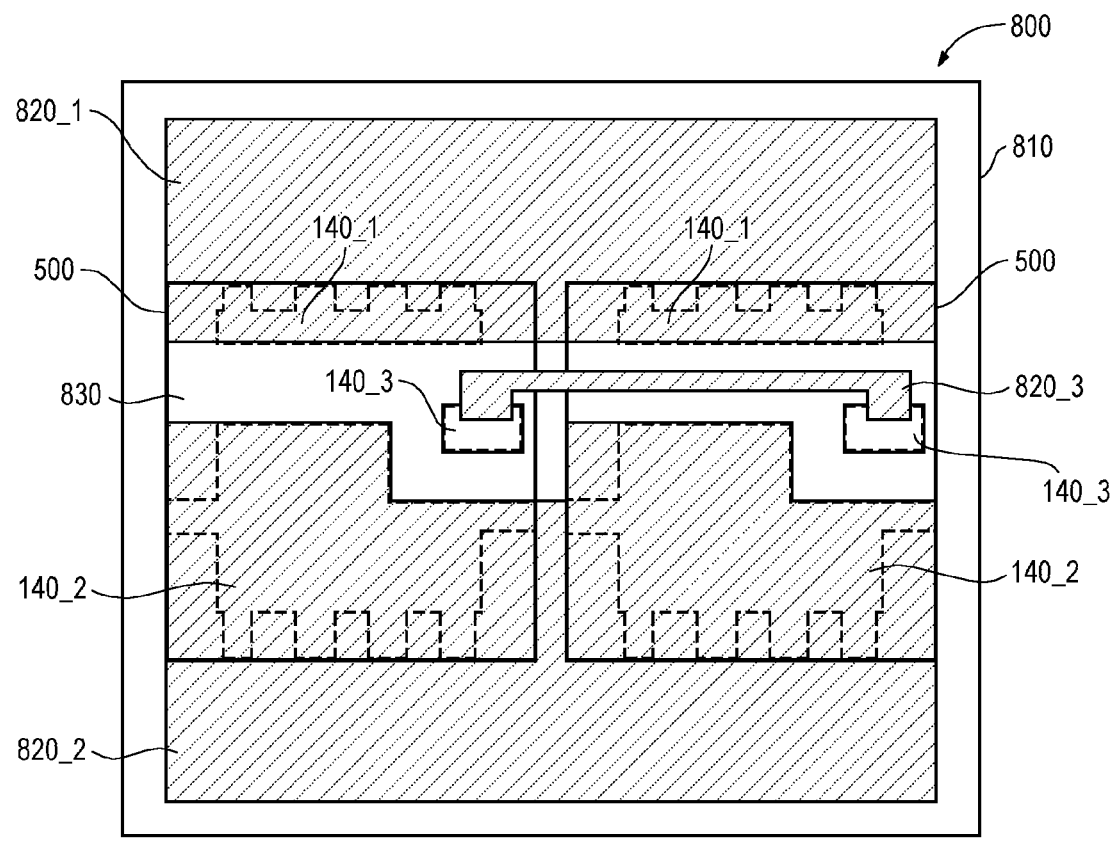
FIG. 8 is an example of an electrical circuitry illustrating footprint parallelization of two exemplary transistor packages mounted on a circuit board.

The transistor packages 100, 500 disclosed herein further provide high suitability for footprint parallelization when mounted on a circuit board. FIG. 8 illustrates an example of an electrical circuitry 800 which comprises two exemplary transistor packages 500 mounted on a circuit board 810, e.g. a PCB (printed circuit board) or a ceramic based circuit board (e.g. a DCB (direct ceramic bonded) carrier). The electrical circuitry 800 includes a plurality (in this example: two) of transistor packages 500 (or, in other examples, transistor packages 100). The transistor packages 500 are mounted side-by-side in a lateral direction on the circuit board 810.

A first conductor 820_1 and a second conductor 820_2 are provided by the circuit board 810. The first conductor 820_1 and/or the second conductor 820_2 may, e.g., be conductor tracks of the circuit board 810 which are configured to connect the transistor packages 500 to further circuitry (not shown) which may, e.g., also be mounted on the circuit board 810.

The first terminals 140_1 of the transistor packages 500 are electrically connected to each other by the first conductor 820_1. The second terminals 140_2 of the transistor packages 500 are electrically connected to each other by the second conductor 820_2. Further, the control terminals 140_3 of the transistor packages 500 are electrically connected to each other by a control conductor 820_3 provided on the circuit board 810.

The first conductor 820_1 and the second conductor 820_2 are spaced apart from each other by a spacing region 830 extending along the lateral direction between the first conductor 820_1 and the second conductor 820_2. The control conductor 820_3 extends within the spacing region 830. The spacing region 830 may align with and be of the same spacing distance as the gap between the first terminal 140_1 and the second terminal 140_2 at the bottom of the transistor package 500. This allows to always maintain sufficient creepage distance between drain and source and between drain and gate not only at the bottom of the transistor package 500 but also at the circuit board 810. The first conductor 820_1, the second conductor 820_2 and the control conductor 820_3 are shown hatched in FIG. 8.

In the electrical circuitry 800 the device parasitics, in particular the drain-source inductance, can be kept low. Inside the transistor package 100, 500 this is largely due to the flip-chip structure mentioned above. Outside the transistor package 100, 500, the footprint layout and in particular the position of the control terminals 140_3 (gates) enable direct wiring of the control terminals 140_3 along the shortest possible path and thus with the lowest possible stray inductance.

Hence, in some examples, the transistor packages 100, 500 are GaN transistor packages which may provide for footprint parallelization among neighboring GaN transistor packages 100, 500. Further, the GaN transistor packages 100, 500 may, optionally, provide for footprint compatibility with common MOSFET transistor packages. In this case the transistor packages 100, 500 may provide a seamless replacement option for standard MOSFETs by next generation MV GaN devices without major layout changes at circuit board level.

The footprint parallelization of the electrical circuitry 800 may provide distinct performance advantages for various electrical circuitries, among them, e.g., half-bridge circuitry. Half-bridge circuitry is used for buck converters, e.g. for a DC-DC buck converter as exemplarily shown in FIG. 9.

As known in the art, a half-bridge circuitry 900 includes a high-side power switch 910 and a low side power switch 920. The control terminals 140_3 (e.g. gates) of the high-side power switch 910 and/or of the low-side power switch 920 may be controlled by a controller 930.

For half-bridge circuitry, in particular for buck converters, the efficiency is one of the key performance indicators. In some cases, especially to reduce the losses at the low-side, a parallel setup of transistor packages 100, 500 seems advantageous.

Figure 9:
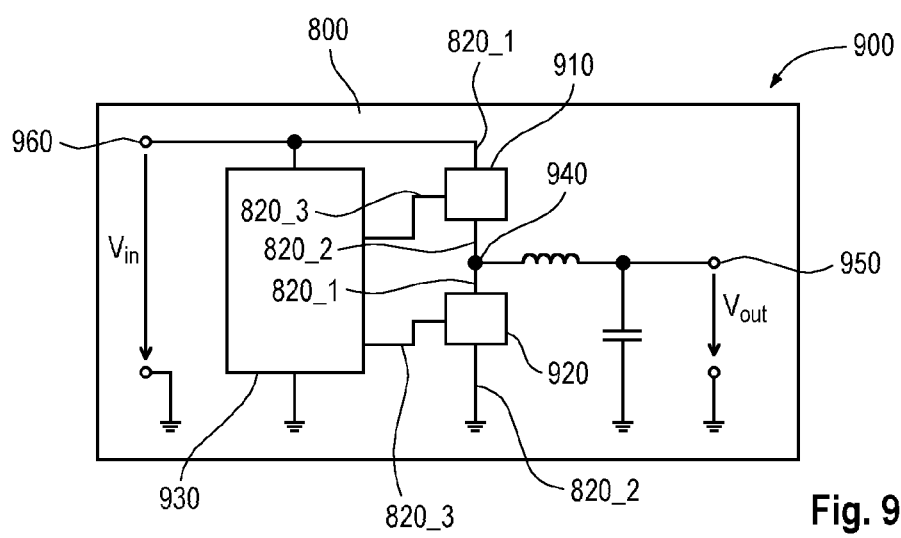
FIG. 9 is an electrical schematic of an exemplary half bridge circuitry implementing the electrical circuitry of FIG. 8.

In the example shown in FIG. 9, the low-side power switch 920 may be implemented by a circuitry 800 as shown in FIG. 8. In this case, the first conductor 820_1 may be connected to a switch node 940 of the half-bridge circuitry 900, the second conductor 820_2 may be connected to common ground and the third conductor 820_3 may, e.g., be connected to the controller 930.

Optionally, the high-side power switch 910 may additionally or alternatively be implemented by a circuitry 800 as shown in FIG. 8. In this case, the second conductor 820_2 may be connected to the switch node 940 of the half-bridge circuitry 900, the first conductor 810_2 may be connected to an input 960 of the half-bridge circuitry 900 and the third conductor 820_3 may, e.g., be connected to the controller 930.

The switch node 940 may be connected to an output 950 of the half-bridge circuitry 900. The input 960 of the half-bridge circuitry 900 may, e.g., also be connected to the controller 930.

Figure 10:
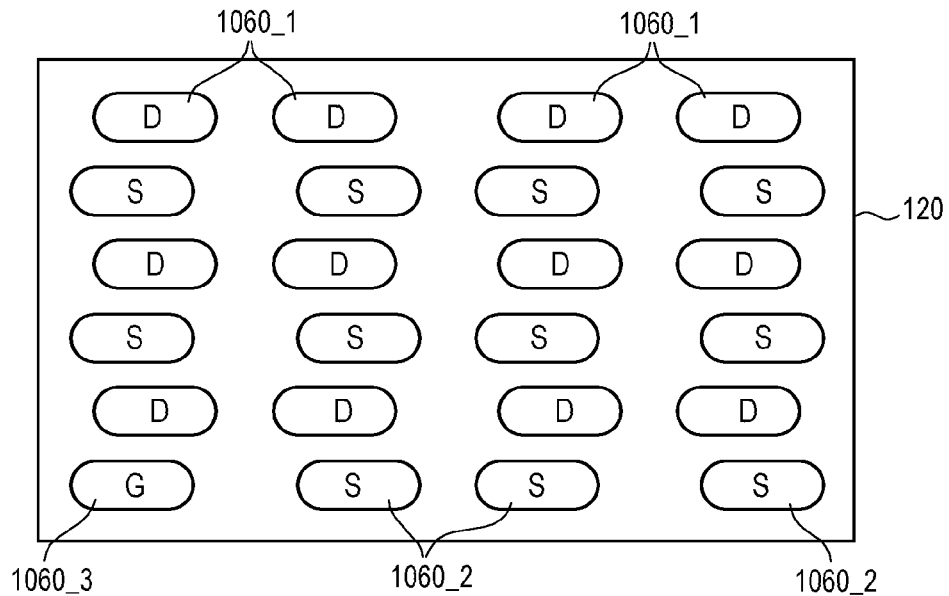
FIG. 10 is a top view of a first surface of a conventional semiconductor transistor chip after contact pads have been applied.

FIG. 10 is a top view on a conventional layout of contact pads of a semiconductor transistor chip 120. In this example the semiconductor transistor chip 120 is, e.g., a lateral GaN-on-Si device. The semiconductor chip 120 may operate in the MV range with a blocking voltage of e.g. about 100 V.

A plurality of first contact pads 1060_1 and a plurality of second contact pads 1060_2 may be provided. In the example shown in FIG. 10, the first contact pads 1060_1 are drain (D) pads that are connected to drain electrode(s) (not visible) of the semiconductor transistor chip 120, and the second contact pads 1060_2 are source (S) pads that are connected to source electrode(s) (not visible) of the semiconductor transistor chip 120. Further, a control contact pad 1060_3 (e.g. a gate (G) pad) is provided.

The conventional layout of contact pads 1060_1, 1060_2, 1060_3 of the semiconductor transistor chip 120 may be provided by a conventional redistribution structure configured to re-route the plurality of first and second load electrodes (not shown) and the control electrode (not shown) to the plurality of first contact pads 1060_1, the plurality of second contact pads 1060_2 and the control contact pad 1060_3, respectively.

The plurality of first contact pads 1060_1 may be arranged in a number of (horizontal) rows parallel to the longitudinal side of the semiconductor transistor chip 120. Likewise, the plurality of second contact pads 1060_2 may be arranged in a number of (horizontal) rows parallel with the rows of the first contact pads 1060_1. In the example shown in FIG. 10 the rows of first contact pads 1060_1 and the rows of second contact pads 1060_2 are interleaved (or alternating) and the first and second contact pads 1060_1, 1060_2 are offset from each other in the longitudinal direction. The control contact pad 1060_3 may be arranged at a corner of the semiconductor transistor chip 120.

This conventional layout of contact pads 1060_1, 1060_2, 1060_3 is apparently inappropriate for use in a transistor package 100, 500 as described above. Therefore, an exemplary redistribution structure is described in the following which may overcome the limitations of the conventional redistribution structure forming a layout of contact pads 1060_1, 1060_2, 1060_3 as shown in FIG. 10.

Figure 11:
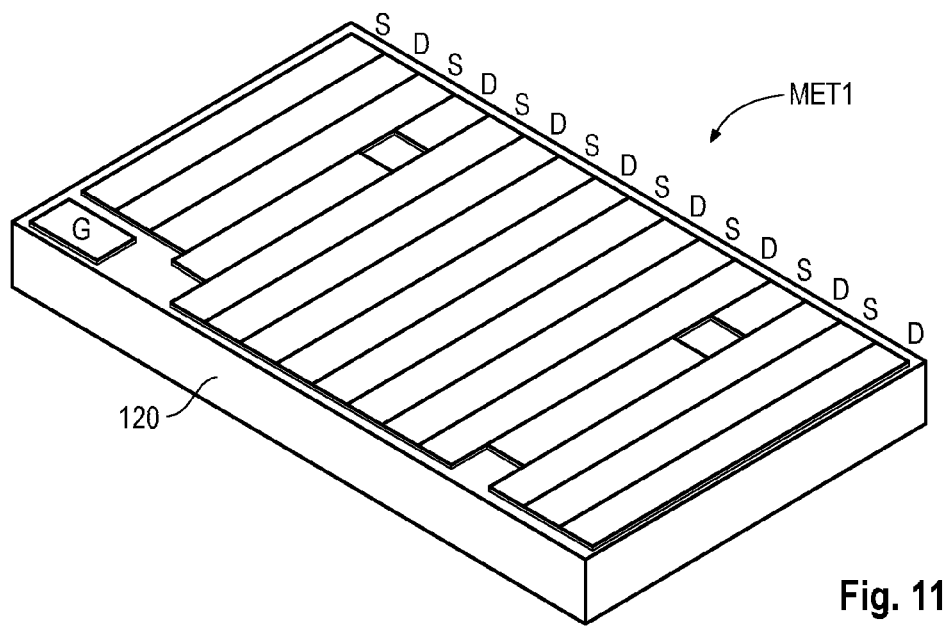
FIG. 11 is a perspective top view of a semiconductor transistor chip after a first metal of a redistribution structure has been applied.
Figure 12:
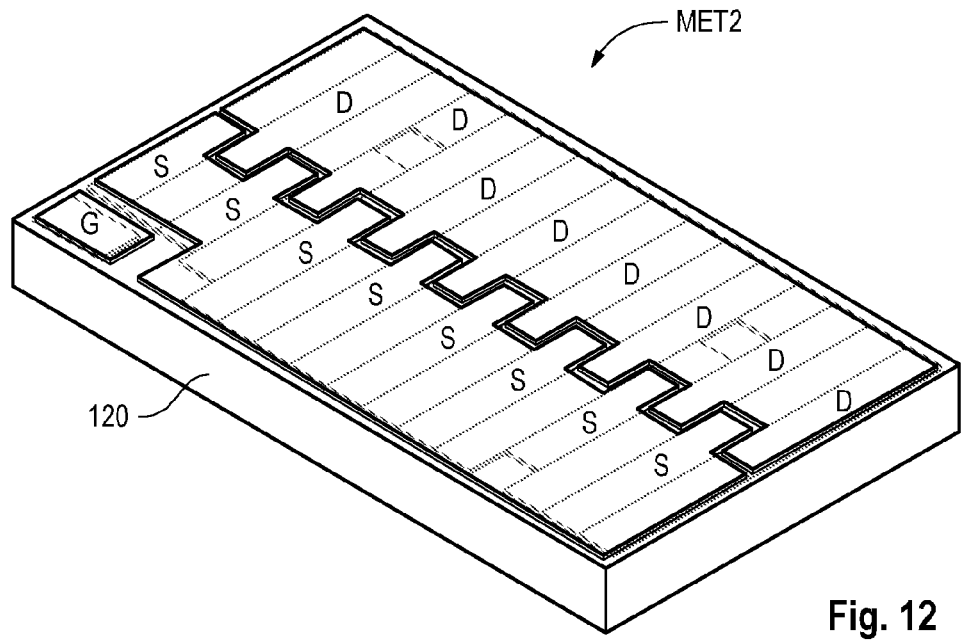
FIG. 12 is a perspective top view of the semiconductor transistor chip of FIG. 11 after a second metal of a redistribution structure has been applied.
Figure 13:
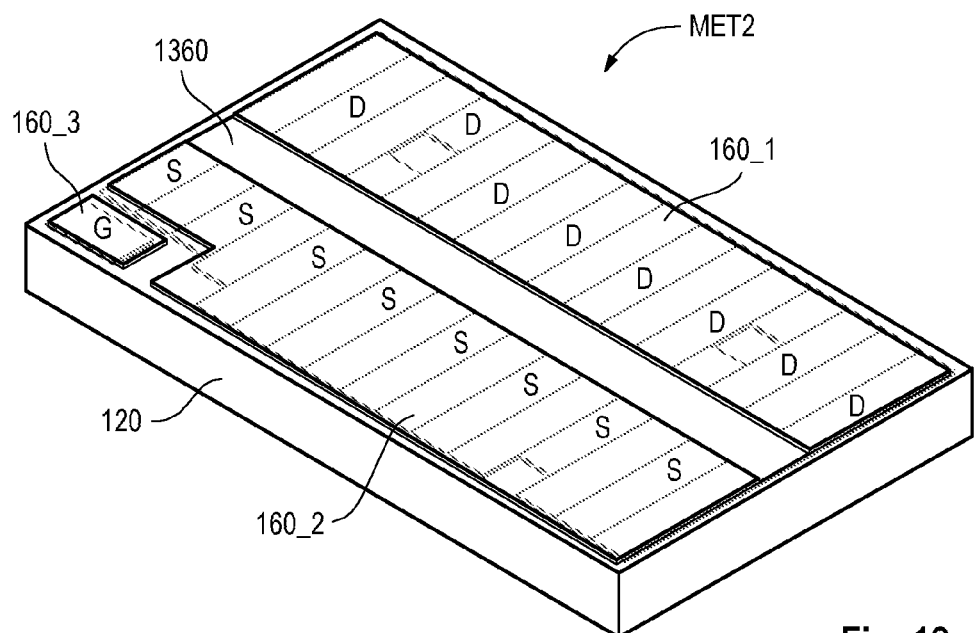
FIG. 13 is a perspective top view of the semiconductor transistor chip of FIG. 12 after a first contact pad, a second contact pad and a control pad have been defined in the second metal of the redistribution structure.

FIGS. 11 to 13 illustrate an exemplary redistribution structure applied to the semiconductor transistor chip 120 over the first surface 120A. The redistribution structure may comprise one or more structured metal layers between which structured insulating layers (not shown) are disposed. The stack of alternating structured metal layers and insulating layers allows to arrive at a contact pad layout (see e.g. FIGS. 2, 5, 13) which is geometrically different from the layout of the load electrodes (not shown) of the semiconductor transistor chip 120.

FIG. 11 illustrates routing in a first structured metal MET1. As apparent from FIG. 11, routing in MET1 may be implemented by metal stripes oriented perpendicular to the longitudinal side of the semiconductor chip 120 and being associated in alternating order with D and S.

FIG. 12 illustrates a second structured metal MET2 arranged over the first structured metal MET1 with an insulating layer (not shown) between MET1 and MET2. As apparent from FIG. 12, the second metal MET2 rerouting may serve to reposition D metal and S metal to opposite longitudinal sides of the semiconductor transistor chip 120.

FIG. 13 illustrates the layout of a first contact pad (D) 160_1, a second contact pad (S) 160_2 and a control contact pad (G) 160_3. The first contact pad (D) 160_1, the second contact pad (S) 160_2 and the control contact pad (G) 160_3 may be formed by areas of metal MET2 of the redistribution structure which may, e.g., be defined by covering the interdigitated central region of the metal MET2 structure by an insulating layer 1360 (e.g. a longitudinal stripe of a dielectric material applied on the second structured metal MET2). Compared to the conventional contact pad layout of FIG. 10, the exemplary contact pad layout of FIG. 13 is differently designed in order to achieve an aggregation of all source contacts and drain contacts.

In other words, the first contact pad 160_1 is coupled to the plurality of first load electrodes (not shown) of the semiconductor transistor chip 120 and, in the transistor package 100, 500, electrically coupled to the first terminal 140_1. The second contact pad 160_2 is coupled to the plurality of second load electrodes (not shown) of the semiconductor transistor chip 120 and, in the transistor package 100, 500, electrically coupled to the second terminal 140_2. The control contact pad 160_3 is electrically coupled to the control load electrode (not shown) of the semiconductor transistor chip 120 and, in the transistor package 100, 500, electrically coupled to the control terminal 140_3. As mentioned before, electrical bonding between the redistribution structure (i.e. the first, second and control contact pads 160_1, 160_2, 160_3) and the package terminals (i.e. the first, second and control terminals 140_1, 140_2, 140_3) may be carried out by soldering or, e.g., other bonding techniques such as e.g. sintering or gluing.

The following examples pertain to further aspects of the disclosure:

Example 1 is a transistor package which comprises a semiconductor transistor chip having a first surface and a second surface opposite the first surface. The semiconductor transistor chip comprises one or a plurality of first load electrodes, one or a plurality of second load electrodes and a control electrode on the first surface. A leadframe faces the first surface of the semiconductor transistor chip. The leadframe comprises a first terminal, a second terminal and a control terminal of the transistor package. The first terminal, the second terminal and the control terminal are exposed at a bottom of the transistor package. The first terminal is electrically coupled to the one or a plurality of first load electrodes. The second terminal is electrically coupled to the one or a plurality of second load electrodes. The control terminal is electrically coupled to the control electrode. The first terminal is aligned with a first side of the transistor package. The second terminal is aligned with a second side opposite the first side of the transistor package. The control terminal is aligned with a third side of the transistor package. The third side of the transistor package connects between the first side and the second side of the transistor package.

In Example 2, the subject matter of Example 1 can optionally include wherein the control terminal is arranged between the first terminal and the second terminal.

In Example 3, the subject matter of Example 1 or 2 can optionally include wherein the first terminal and the second terminal are spaced apart at the bottom of the package by a gap, and the control terminal is located within the gap.

In Example 4, the subject matter of any preceding Example can optionally include wherein the first terminal is the drain terminal of the transistor package, the second terminal is the source terminal of the transistor package, and wherein the second terminal has a polygonal shape with a cutout corner area, the cutout corner area faces the first terminal and the control terminal is located within the cutout corner area.

In Example 5, the subject matter of any preceding Example can optionally include wherein the semiconductor transistor chip is a GaN chip.

In Example 6, the subject matter of Example 5 can optionally include wherein the GaN chip is a lateral GaN-on-Si device.

In Example 7, the subject matter of Example 5 or 6 can optionally include wherein the semiconductor transistor chip comprises a plurality of first load electrodes and a plurality of second load electrodes, the transistor package further comprising: an electrical redistribution structure configured to re-route the plurality of first load electrodes to one first contact pad and the plurality of second load electrodes to one second contact pad, wherein the first contact pad and the second contact pad are exposed at a surface of the electrical redistribution structure facing away from the semiconductor transistor chip, and wherein the first contact pad is electrically coupled to the first terminal and the second contact pad is electrically coupled to the second terminal.

In Example 8, the subject matter of Example 7 can optionally include wherein the plurality of first load electrodes and the plurality of second load electrodes are arranged in an alternating order.

In Example 9, the subject matter of Example 8 can optionally include wherein the first contact pad is soldered or sintered or glued to the first terminal and the second contact pad is soldered or sintered or glued to the second terminal.

In Example 10, the subject matter of any of the preceding Examples can optionally include wherein the transistor package comprises a molded encapsulant.

In Example 11, the subject matter of any of the preceding Examples can optionally include wherein the transistor package comprises a power switch configured to switch voltages equal to or greater than 50 V or 100 V or 150 V or 200 V.

Example 12 is an electrical circuitry comprising: a circuit board; a plurality of transistor packages of any of the preceding Examples, the transistor packages are mounted side-by-side in a lateral direction on the circuit board, wherein the first terminals of the transistor packages are electrically connected by a first conductor provided by the circuit board; the second terminals of the transistor packages are electrically connected by a second conductor provided by the circuit board; and the control terminals of the transistor packages are electrically connected by a control conductor provided by the circuit board; wherein the first conductor and the second conductor are spaced apart from each other by a spacing region extending along the lateral direction between the first conductor and the second conductor, and wherein the control conductor extends within the spacing region.

Example 13 is a half-bridge circuitry comprising a high-side power switch and a low-side power switch, wherein at least one of the high-side power switch and the low-side power switch comprises the electrical circuitry of Example 12.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor package, comprising:
   a semiconductor transistor chip having a first surface and a second surface opposite the first surface, the semiconductor transistor chip comprising one or a plurality of first load electrodes, one or a plurality of second load electrodes and a control electrode on the first surface; and
   a leadframe facing the first surface of the semiconductor transistor chip, the leadframe comprising a first terminal, a second terminal and a control terminal of the transistor package, the first terminal, the second terminal and the control terminal being exposed at a bottom of the transistor package,
   wherein the first terminal is electrically coupled to the one or a plurality of first load electrodes,
   wherein the second terminal is electrically coupled to the one or a plurality of second load electrodes,
   wherein the control terminal is electrically coupled to the control electrode,
   wherein the first terminal extends to and is exposed at first side of the transistor package,
   wherein the second terminal extends to and is exposed at a second side opposite the first side of the transistor package,
   wherein the control terminal extends to and is exposed at a third side of the transistor package "after" control electrode,
   wherein the third side of the transistor package connects between the first side and the second side of the transistor package.

2. The transistor package of claim 1, wherein the control terminal is arranged between the first terminal and the second terminal.

3. The transistor package of claim 1, wherein the first terminal and the second terminal are spaced apart at the bottom of the transistor package by a gap, and wherein the control terminal is located within the gap.

4. The transistor package of claim 1, wherein the first terminal is a drain terminal of the transistor package, wherein the second terminal is a source terminal of the transistor package, wherein the second terminal has a polygonal shape with a cutout corner area, and wherein the cutout corner area faces the first terminal and the control terminal is located within the cutout corner area.

5. The transistor package of claim 1, wherein the semiconductor transistor chip is a GaN chip.

6. The transistor package of claim 5, wherein the GaN chip is a lateral GaN-on-Si device.

7. The transistor package of claim 5, wherein the semiconductor transistor chip comprises a plurality of first load electrodes and a plurality of second load electrodes, the transistor package further comprising:
   an electrical redistribution structure configured to re-route the plurality of first load electrodes to one first contact pad and the plurality of second load electrodes to one second contact pad, wherein the first contact pad and the second contact pad are exposed at a surface of the electrical redistribution structure facing away from the semiconductor transistor chip, and
   wherein the first contact pad is electrically coupled to the first terminal and the second contact pad is electrically coupled to the second terminal.

8. The transistor package of claim 7, wherein the plurality of first load electrodes and the plurality of second load electrodes are arranged in an alternating order.

9. The transistor package of claim 8, wherein the first contact pad is soldered or sintered or glued to the first terminal, and wherein the second contact pad is soldered or sintered or glued to the second terminal.

10. The transistor package of claim 1, wherein the transistor package comprises a molded encapsulant.

11. The transistor package of claim 1, wherein the transistor package comprises a power switch configured to switch voltages equal to or greater than 50 V or 100 V or 150 V or 200 V.

12. Electrical circuitry, comprising:
   a circuit board; and
   a plurality of transistor packages of claim 1 mounted side-by-side in a lateral direction on the circuit board,
   wherein the first terminals of the transistor packages are electrically connected by a first conductor provided by the circuit board,
   wherein the second terminals of the transistor packages are electrically connected by a second conductor provided by the circuit board,
   wherein the control terminals of the transistor packages are electrically connected by a control conductor provided by the circuit board,
   wherein the first conductor and the second conductor are spaced apart from each other by a spacing region extending along the lateral direction between the first conductor and the second conductor,
   wherein the control conductor extends within the spacing region.

13. Half-bridge circuitry comprising a high-side power switch and a low-side power switch, wherein at least one of the high-side power switch and the low-side power switch comprises the electrical circuitry of claim 12.

* * * * *